(12) United States Patent
Tan et al.

(10) Patent No.: US 11,538,865 B2
(45) Date of Patent: Dec. 27, 2022

(54) DISPLAY PANEL AND DISPLAY APPARATUS

(71) Applicant: BOE TECHNOLOGY GROUP CO., LTD., Beijing (CN)

(72) Inventors: Wenjing Tan, Beijing (CN); Hui Zhao, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 328 days.

(21) Appl. No.: 16/945,651

(22) Filed: Jul. 31, 2020

(65) Prior Publication Data

US 2021/0043698 A1 Feb. 11, 2021

(30) Foreign Application Priority Data

Aug. 7, 2019 (CN) .......................... 201910727205.2

(51) Int. Cl.
*H01L 27/32* (2006.01)
*H01L 51/00* (2006.01)
*H05K 5/00* (2006.01)
*H05K 5/02* (2006.01)

(52) U.S. Cl.
CPC ...... *H01L 27/3218* (2013.01); *H01L 27/3267* (2013.01); *H01L 51/0097* (2013.01); *H05K 5/0017* (2013.01); *H05K 5/0217* (2013.01); *H01L 2251/5338* (2013.01)

(58) Field of Classification Search
CPC .................................................. H01L 27/3218
See application file for complete search history.

(56) References Cited

U.S. PATENT DOCUMENTS

| | | | | |
|---|---|---|---|---|
| 10,310,560 | B2* | 6/2019 | Choi | G06F 1/1652 |
| 10,466,746 | B2* | 11/2019 | Hong | G06F 1/1637 |
| 11,269,206 | B2* | 3/2022 | Yang | H01L 51/0097 |
| 2008/0284719 | A1 | 11/2008 | Yoshida | |

(Continued)

FOREIGN PATENT DOCUMENTS

| CN | 105514139 A | 4/2016 |
|---|---|---|
| CN | 105742321 A | 7/2016 |

(Continued)

OTHER PUBLICATIONS

Office Action dated Jan. 28, 2021 in Chinese Application No. 201910727205.2, with English translation.

*Primary Examiner* — Vip Patel
(74) *Attorney, Agent, or Firm* — McDermott Will & Emery LLP

(57) ABSTRACT

A display panel includes a base, a plurality of first pixels disposed on the base, and at least one second pixel disposed on the base. The base has a plurality of island regions spaced apart and a plurality of bridge regions connecting the plurality of island regions. Each bridge region includes a first region and two second regions disposed on two opposite sides of the first region. Each second region is directly connected to a corresponding one of the plurality of island regions. The base includes a plurality of openings, each opening is disposed between two adjacent bridge regions. Each island region is provided with at least one first pixel therein. The at least one second pixel is disposed in at least one of second regions of the plurality of bridge regions.

17 Claims, 18 Drawing Sheets

(56) References Cited

U.S. PATENT DOCUMENTS

| | | |
|---|---|---|
| 2012/0261551 A1 | 10/2012 | Rogers |
| 2016/0104756 A1 | 4/2016 | Lee et al. |
| 2016/0190389 A1 | 6/2016 | Lee et al. |
| 2018/0052493 A1 | 2/2018 | Hong et al. |
| 2018/0174523 A1 | 6/2018 | Jeon et al. |
| 2019/0107911 A1 | 4/2019 | Zhai |
| 2020/0105170 A1 | 4/2020 | Dai et al. |
| 2020/0184856 A1 | 6/2020 | Wang et al. |
| 2020/0274088 A1 | 8/2020 | Luo et al. |
| 2021/0013434 A1 | 1/2021 | Cao et al. |

FOREIGN PATENT DOCUMENTS

| | | |
|---|---|---|
| CN | 108649054 A | 10/2018 |
| CN | 109189265 A | 1/2019 |
| CN | 109308851 A | 2/2019 |
| CN | 109599402 A | 4/2019 |
| CN | 109830517 A | 5/2019 |

\* cited by examiner

DISPLAY PANEL AND DISPLAY APPARATUS

CROSS-REFERENCE TO RELATED APPLICATION

This application claims priority to and the benefit of Chinese Patent Application No. 201910727205.2, filed on Aug. 7, 2019, which is incorporated herein by reference in its entirety.

TECHNICAL FIELD

The present disclosure relates to the field of display technologies, and in particular, to a display panel and a display apparatus.

BACKGROUND

A stretchable display apparatus is a kind of display apparatus different from a foldable display apparatus. A part of a screen that is originally hidden in the stretchable display apparatus can be pulled out from an inside of the display apparatus by pulling the screen. Therefore, an area of the screen of the stretchable display apparatus can be expanded, and an overall effective display area of the stretchable display apparatus can be increased by about 50% or even more.

SUMMARY

In an aspect, embodiments of the present disclosure provide a display panel. The display panel includes a base, a plurality of first pixels disposed on the base, and at least one second pixel disposed on the base. The base has a plurality of island regions spaced apart and a plurality of bridge regions connecting the plurality of island regions. Each bridge region includes a first region and two second regions disposed on two opposite sides of the first region. And each second region is directly connected to a corresponding one of the plurality of island regions. The base includes a plurality of openings, each opening is disposed between two adjacent bridge regions. Each island region is provided with at least one first pixel therein. The at least one second pixel is disposed in at least one of second regions of the plurality of bridge regions.

In some embodiments, the at least one first pixel includes a plurality of first pixels arranged in M rows by N columns in an island region. One of M and N is an integer greater than or equal to 1, and another is an integer greater than or equal t2.

In some embodiments, M and N are integers greater than or equal to 2.

In some embodiments, the at least one second pixel includes a plurality of second pixels. A first second region in the plurality of bridge regions is disposed on a side of first pixels in a first row in the island region away from first pixels in an M-th row, and a second second region is disposed on a side of the first pixels in the M-th row in the island region away from the first pixels in the first row. At least one of the first second region and the second second region is provided with a first pixel group including two or more second pixels therein, and the two or more second pixels are arranged along a first direction parallel to a row direction of the plurality of first pixels.

In some embodiments, a region where each second pixel in the first pixel group is located and regions where a column of first pixels in an adjacent island region are located are arranged in a direction perpendicular to the first direction. And, a geometric center of each second pixel in the first pixel group is in a same straight line as geometric centers of the first pixels in the column in the adjacent island region.

In some embodiments, a length of the second pixel in the first pixel group in the first direction is equal to a length of one of the first pixels in the column in the first direction.

In some embodiments, each of the second pixel in the first pixel group and the first pixels in the column includes a first color sub-pixel, a second color sub-pixel and a third color sub-pixel that are sequentially arranged along the first direction. Lengths of the first color sub-pixel, the second color sub-pixel and the third color sub-pixel in the first direction are equal.

In some embodiments, the at least one second pixel includes a plurality of second pixels. A third second region in the plurality of bridge regions is disposed on a side of first pixels in a first column in the island region away from first pixels in an N-th column, and a fourth second region is disposed on a side of the first pixels in the N-th column in the island region away from the first pixels in the first column. At least one of the third second region and the fourth second region is provided with a second pixel group including two or more second pixels therein, and the two or more second pixels are arranged along a second direction parallel to a column direction of the plurality of first pixels.

In some embodiments, a region where each second pixel in the second pixel group is located and regions where a row of first pixels in an adjacent island region are located are arranged in a direction perpendicular to the second direction. And a geometric center of each second pixel in the second pixel group is in a same straight line as geometric centers of the first pixels in the row in the adjacent island region.

In some embodiments, a width of the second pixel in the second pixel group in the second direction is equal to a width of one first pixel of the first pixels in the row in the second direction.

In some embodiments, each of the second pixel in the second pixel group and the first pixels in the row includes a first color sub-pixel, a second color sub-pixel and a third color sub-pixel. And the first color sub-pixel, the second color sub-pixel and the third color sub-pixel in each first pixel in the row are arranged along a first direction parallel to a row direction of the plurality of first pixels. And the first color sub-pixel, the second color sub-pixel and the third color sub-pixel in the second pixel are arranged along the second direction or along the first direction.

In some embodiments, the first color sub-pixel, the second color sub-pixel and the third color sub-pixel in the second pixel are arranged along the second direction. The first color sub-pixel, the second color sub-pixel and the third color sub-pixel are sequentially arranged along a direction from first pixels in an M-th row in the island region to first pixels in a first row. Or, the first color sub-pixel, the second color sub-pixel and the third color sub-pixel are sequentially arranged along a direction from the first pixels in the first row in the island region to the first pixels in the M-th row.

In some embodiments, a first second region in the plurality of bridge regions is disposed on a side of first pixels in a first row in the island region away from first pixels in an M-th row, and a second second region is disposed on a side of the first pixels in the M-th row in the island region away from the first pixels in the first row. At least one of the first second region and the second second region is provided with a first pixel group including two or more second pixels therein, and the two or more second pixels are arranged along a first direction parallel to a row direction of the plurality of first pixels.

In some embodiments, the plurality of island regions are arranged in an array. The plurality of bridge regions include a plurality of groups of bridge regions, and each group of bridge regions includes a first bridge region, a second bridge region, a third bridge region and a fourth bridge region. Each island region is directly connected to one second region in a first bridge region, one second region in a second bridge region, one second region in a third bridge region, and one second region in a fourth bridge region in a corresponding group of bridge regions. The one second region in the first bridge region and the one second region in the second bridge region are disposed on opposite first and second sides of the island region, and the one second region in the third bridge region and the one second region in the fourth bridge region are disposed on opposite third and fourth sides of the island region. Another second region in the first bridge region is directly connected to one of the plurality of island regions located at the first side of the island region and closest to the island region, and another second region in the second bridge region is directly connected to one of the plurality of island regions located at the second side of the island region and closest to the island region. The island region, the one of the plurality of island regions located at the first side of the island region, and the one of the plurality of island regions located at the second side of the island region are located in a same row of island regions. Another second region in the third bridge region is directly connected to one of the plurality of island regions located at the third side of the island region and closest to the island region, and another second region in the fourth bridge region is directly connected to one of the plurality of island regions located at the fourth side of the island region and closest to the island region. The island region, the one of the plurality of island regions located at the third side of the island region, and the one of the plurality of island regions located at the fourth side of the island region are located in a same column of island regions.

In another aspect, embodiments of the present disclosure provide a display apparatus, which includes at least one display panel as described above.

In some embodiments, the at least one display panel includes one display panel. The display apparatus further includes a reel, and one side edge of the display panel is fixed to the reel.

In some embodiments, the at least one display panel includes two display panels. The display apparatus further comprises sliding guide rails disposed on two opposite sides of the first display panel, and sliders disposed on two opposite sides of the second display panel. And each slider is arranged in a corresponding sliding guide rail and slidably connected to the corresponding sliding guide rail.

BRIEF DESCRIPTION OF THE DRAWINGS

In order to describe technical solutions in the present disclosure more clearly, accompanying drawings to be used in some embodiments of the present disclosure will be introduced below briefly. However, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals that the embodiments of the present disclosure relate to.

DETAILED DESCRIPTION

The technical solutions in some embodiments of the present disclosure will be described clearly and completely with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof, such as the third-person singular form "comprises" and the present participle form "comprising", in the description and the claims are construed as open and inclusive, i.e., "inclusive, but not limited to". In the description, terms such as "one embodiment", "some embodiments", "exemplary embodiments", "example", "some examples", or "specific example" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

In addition, the terms such as "first" and "second" are used for descriptive purposes only, and are not to be construed as indicating or implying the relative importance or implicitly indicating the number of indicated technical features below. Thus, features defined as "first" and "second" may explicitly or implicitly include one or more of the features. In the description of the embodiments of the present disclosure, term "a plurality of/the plurality of" means two or more unless otherwise specified.

In the description of some embodiments, when elements are referred to as being "connected", the elements can be directly connected or coupled together or one or more intervening, elements may also be present. In contrast, when elements are referred to as being "directly connected", there are no intervening elements present.

A stretchable display apparatus is a display apparatus that can be stretched under an action of a pulling force, thereby expanding an area of the display apparatus. A display panel of the stretchable display apparatus is provided with a plurality of openings. Under the action of the pulling force, the display panel is deformed at the openings, so as to achieve stretching of the stretchable display apparatus.

Figure 1:
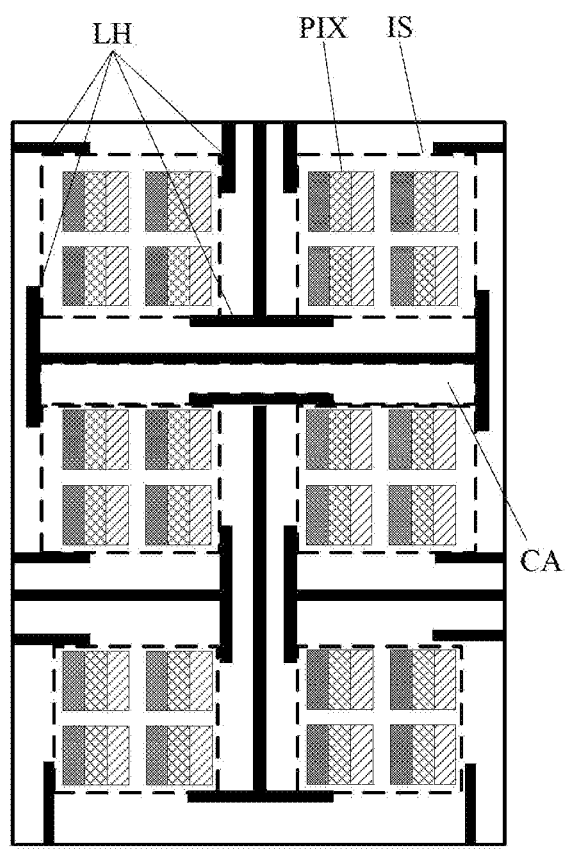
FIG. 1 is a top view of a display panel.

FIG. 1 is a top view of a display panel of a stretchable display apparatus. As shown in FIG. 1, the display panel includes a plurality of display units IS, a plurality of connection parts CA connecting the plurality of display units IS, and a plurality of openings LH. The opening LH is disposed between two adjacent connection parts CA. The display unit IS includes a plurality of pixels PIX.

Figure 2:
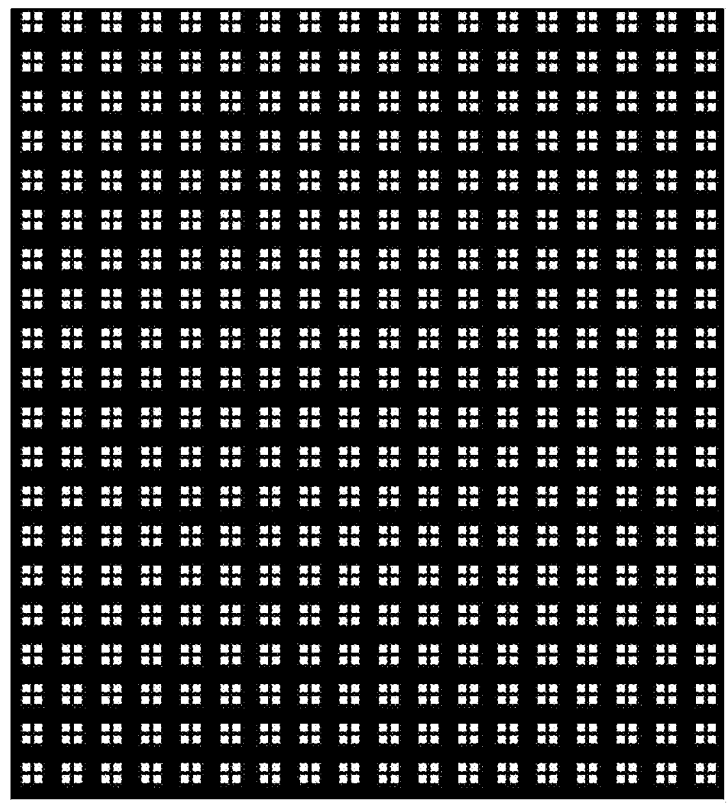
FIG. 2 is a white image-superpixel simulation diagram of the display panel shown in FIG. 1.

FIG. 2 is a white image-superpixel simulation diagram of the display panel shown in FIG. 1. It can be seen from FIG. 2 that, when the display panel displays a white image, there may be many dark regions in the white image with an obvious screen door effect, and the image may not be full.

Figure 3:
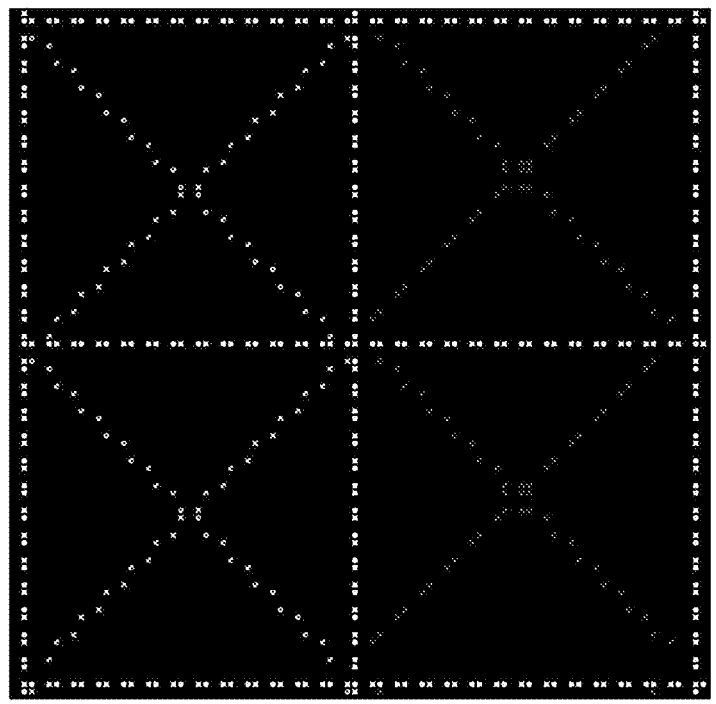
FIG. 3 is a line-superpixel simulation diagram of the display panel shown in FIG. 1.

FIG. 3 is a line-superpixel simulation diagram of the display panel shown in FIG. 1. It can be seen from FIG. 3 that, when the display panel displays a line pattern, lines may be discontinuous and may be grainy.

Figure 4:
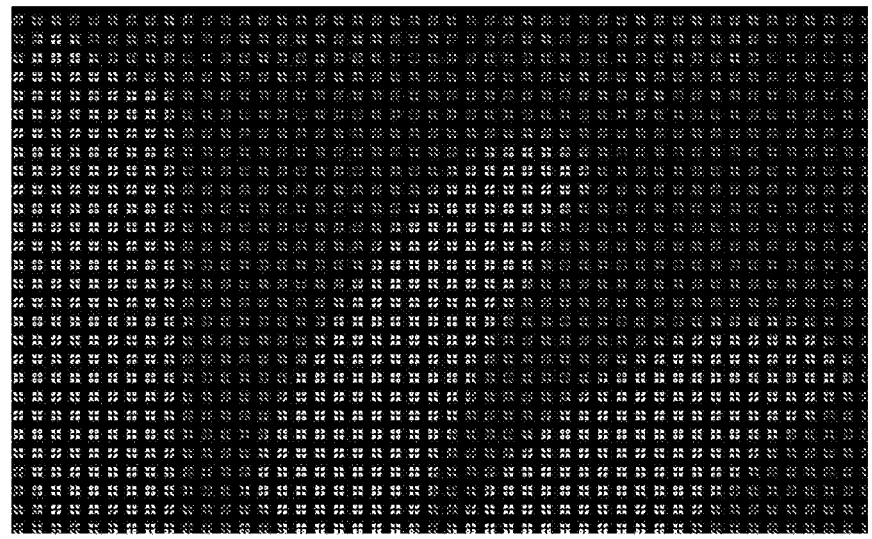
FIG. 4 is a natural image-superpixel simulation diagram of the display panel shown in FIG. 1.

FIG. 4 is a natural image-superpixel simulation diagram of the display panel shown in FIG. 1. It can be seen from FIG. 4 that details of the natural image displayed on the display panel may not be well presented.

As shown in FIG. 1, since in the display area (also called an active area) of the display panel, only regions where the plurality of display units IS are located emit light, and other regions do not emit light. There are many dark regions in the image displayed on the display panel, and an area of the light-emitting region in the display area is very small. Consequently, problems shown in FIGS. 2 to 4 may appear.

Figure 5:
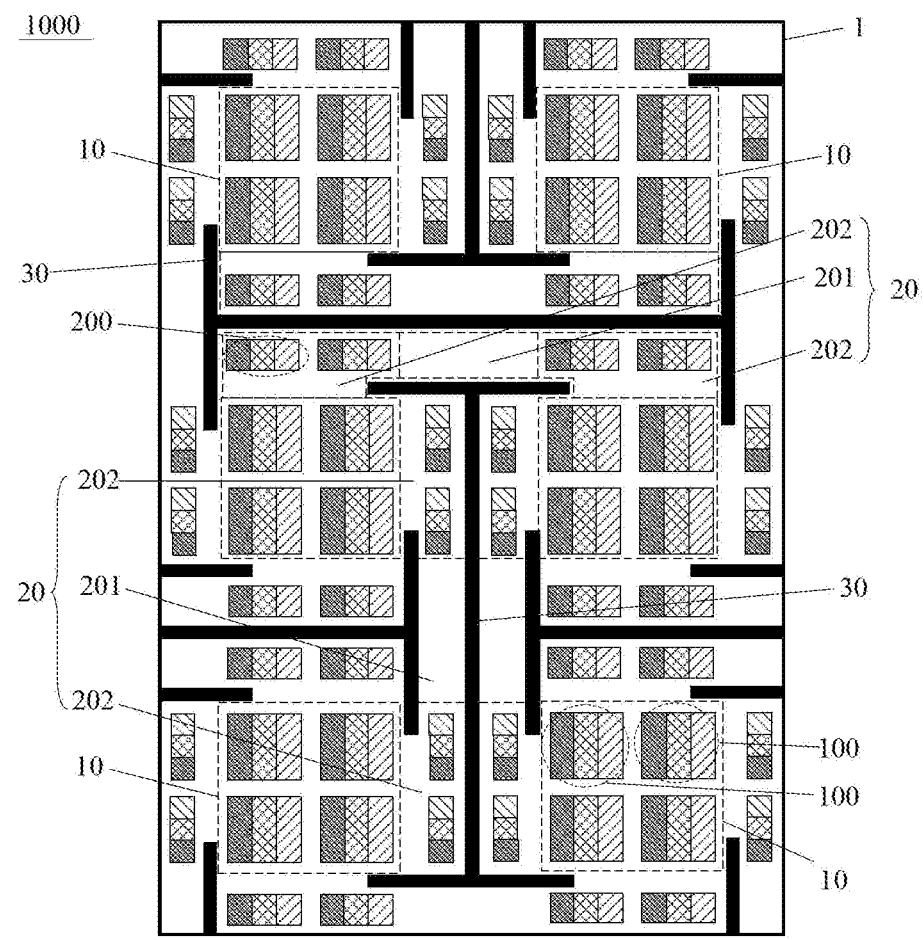
FIG. 5 is a top view of a display panel, in accordance with some embodiments of the present disclosure.

Some embodiments of the present disclosure provide a display panel. As shown in FIG. 5, the display panel 1000 includes a base 1, and a plurality of first pixels 100 and at least one second pixel 200 that are disposed on the base 1. For example, the base 1 is a flexible base, such as a Polyimide (PI) base or a polyethylene terephthalate (PET) base.

Figure 9:
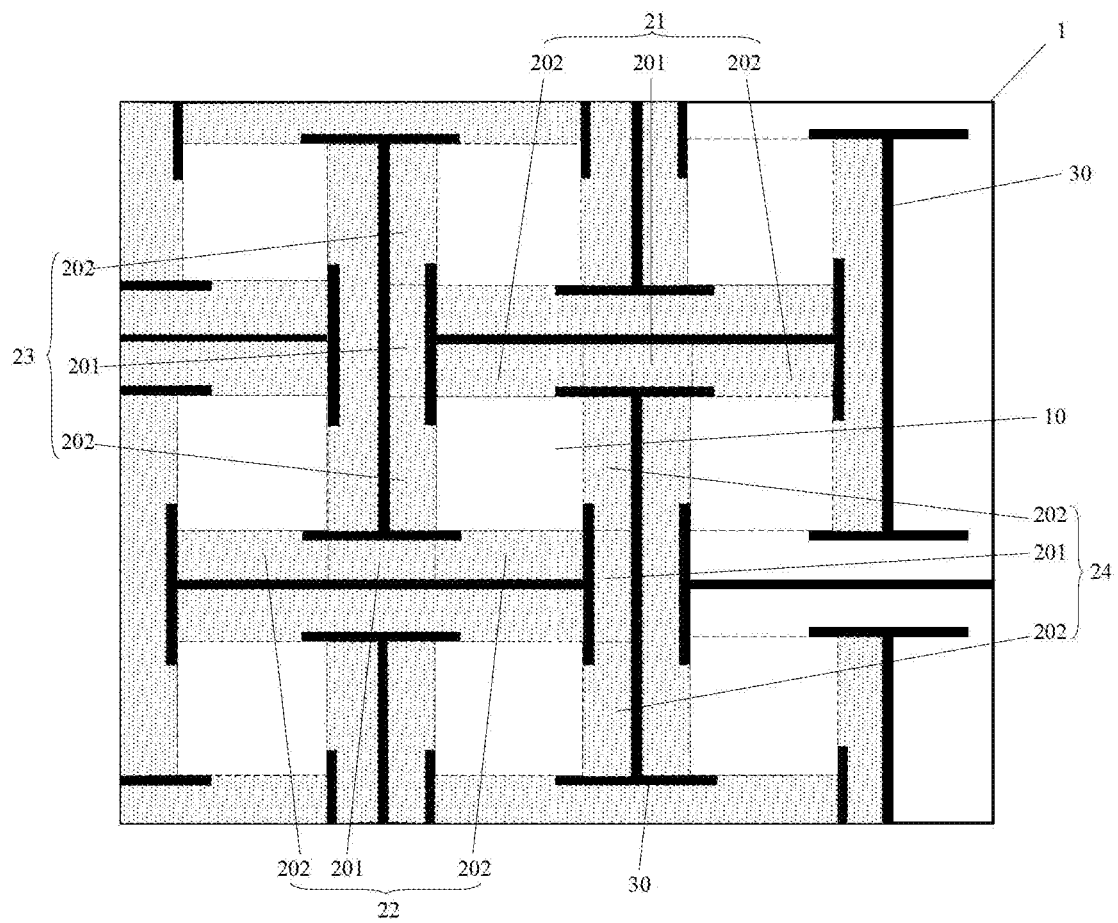
FIG. 9 is a diagram illustrating a positional relationship between island regions and bridge regions of a display panel, in accordance with some embodiments of the present disclosure.
Figure 10:
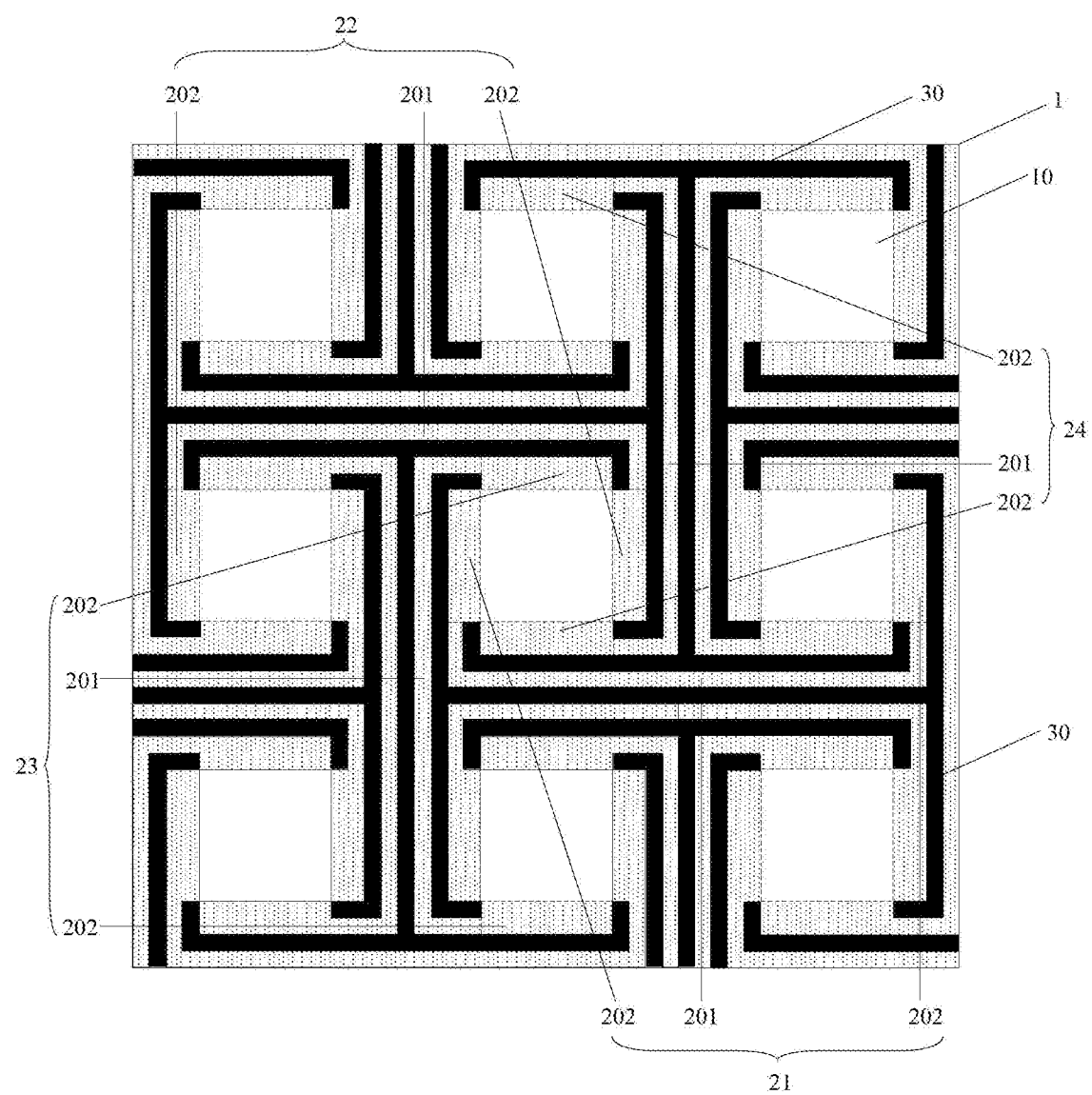
FIG. 10 is a diagram illustrating a positional relationship between island regions and bridge regions of another display panel, in accordance with some embodiments of the present disclosure.

As shown in FIGS. 5, 9 and 10, the base 1 has a plurality of island regions 10 spaced apart, and a plurality of bridge regions 20 connecting the plurality of island regions 10. At least one bridge region 20, such as each bridge region 20 or each of some bridge regions 20, includes a first region 201 and two second regions 202 located on two opposite sides of the first region 201, respectively. Each second region 202 is directly connected to a corresponding island region 10.

As shown in FIGS. 5, 9 and 10, the base 1 includes a plurality of openings 30, and the opening 30 is disposed between two adjacent bridge regions 20. In some examples, an opening 30 is formed in the base 1 and is provided between any two adjacent bridge regions 20. For example, the opening 30 is strip-shaped, such as I-shaped or shaped as the shape shown in FIG. 10. When the display panel 1000 is, subjected to a pulling force, the display panel 1000 is stretched through deformation thereof at the openings 30, thereby achieving stretchable display.

As shown in FIG. 5, the plurality of first pixels 100 are disposed in the plurality of island regions 10. For example, each island region 10 is provided with at least one first pixel 100 therein. For another example, each of some island regions 10 is provided with at least one first pixel 100 therein.

The at least one second pixel 200 is disposed in at least one second region 202 of the plurality of bridge regions 20. In some examples, the at least one second pixel 200 includes a plurality of second pixels 200. In this case, for example, some of second regions 202 of the plurality of bridge regions 20 are each provided with at least one second pixel 200 therein. For another example one second region 202 of each bridge region 20 is provided with at least one second pixel 200 therein. For yet another example, each second region 202 is provided with at least one second pixel 200 therein. That is, as shown in FIG. 5, each of all second regions 202 (for example, four second regions 202) directly connected to an island region 10 is provided with at least one second pixel 200 therein. In this way, the light-emitting region of the display panel 1000 may be increased. Therefore, dark regions, of the display panel 1000 during display may be reduced, and a display effect of the display panel 1000 may be further improved.

For example, each of the first pixel 100 and the second pixel 200 includes a plurality of sub-pixels. The plurality of sub-pixels include a first color sub-pixel, a second color sub-pixel and a third color sub-pixel. The first color, the second color and the third color herein are three primary colors (for example, red, green and blue, respectively). All the first pixels 100 and all the second pixels 200 collectively serve as pixels in the display panel 1000 for image display.

For example, the sub-pixel includes a light-emitting device. For another example, the sub-pixel further includes a driving circuit for driving the light-emitting device to emit light. The light-emitting device may be an organic light emitting diode (OLED) device. The light-emitting device may include a light-emitting functional layer, a first electrode located on a side of the light-emitting functional layer away from the base, and a second electrode located between the light-emitting functional layer and the base. The light-emitting functional layer may include a light-emitting layer. Optionally, in addition to the light-emitting layer, the light-emitting functional layer further includes at least one of an electronic transport layer (ETL), an electronic injection layer (EIL), a hole transport layer (HTL) or a hole injection layer (HIL). The second electrode may be electrically connected to the driving circuit through, for example, a via hole passing through at least one insulating layer.

All first pixels 100 located in the island region 10 constitute a display unit. It will be understood by the skilled in the art that, in order to realize normal display for all first pixels 100 in the island region 10, signals will be provided to all the sub-pixels of the first pixels 100 in the island region 10 through signal lines. With respect to each signal line, it is not connected to only one sub-pixel or some sub-pixels in the island region 10, but are connected to sub-pixels in multiple island regions 10. The signal line may pass through multiple bridge regions 20, so that the signal line may be connected to sub-pixels in different island regions 10. For example, the signal lines include gate lines and data lines.

FIG. 5 only shows some island regions 10 of the display panel 1000, and the embodiments of the present disclosure do not limit the number of island regions 10 included in the display panel 1000. One island region 10 may be provided with one or more first pixels 100 therein, and the embodiments of the present disclosure do not limit the number of first pixels 100 provided in the island region 10. The number and arrangement of the bridge regions 20 are determined according to the number and arrangement of the island regions 10, as long as normal display of all first pixels 100 located in the island region 10 can be realized.

Figure 6:
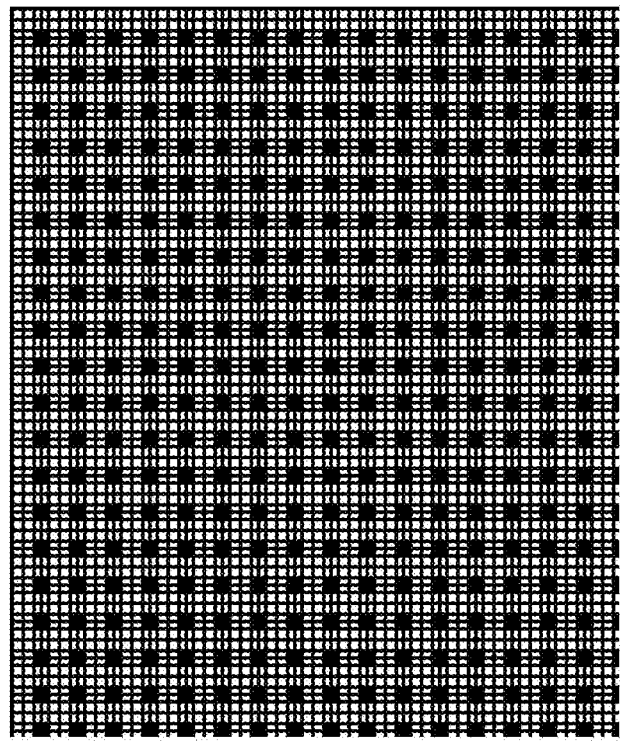
FIG. 6 is a white image-superpixel simulation diagram of a display panel, in accordance with some embodiments of the present disclosure.

FIG. 6 is a white image-superpixel simulation diagram of the display panel 1000 shown in FIG. 5. As shown in FIG. 6, there may be less dark regions in the white image displayed on the display panel 1000 with an insignificant screen door effect, and the image may be fuller.

Figure 7:
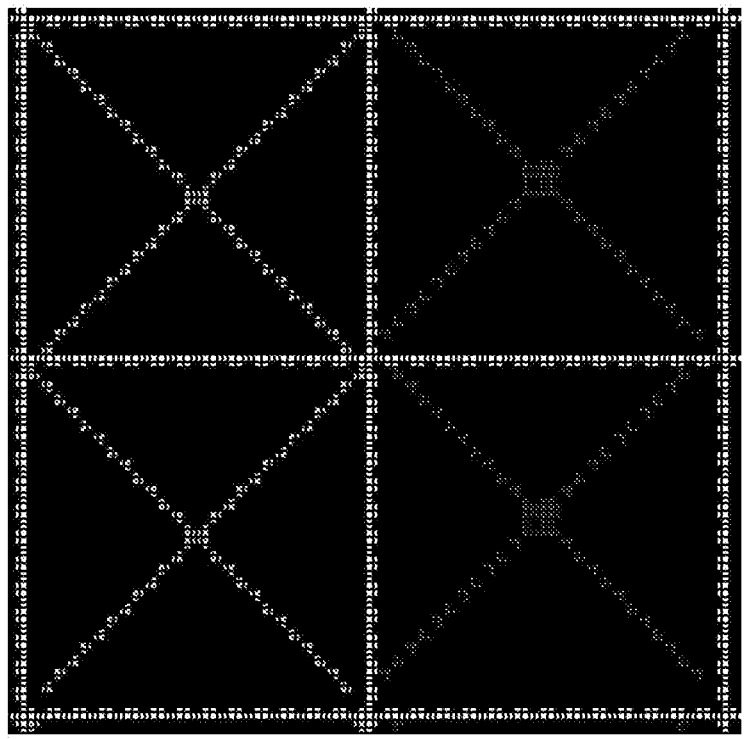
FIG. 7 is a line-superpixel simulation diagram of a display panel in accordance with some embodiments of the present disclosure.

FIG. 7 is a line-superpixel simulation diagram of the display panel 1000 shown in FIG. 5. It can be seen that when the display panel 1000 displays a line pattern, the continuity of the line pattern may be relatively higher.

Figure 8:
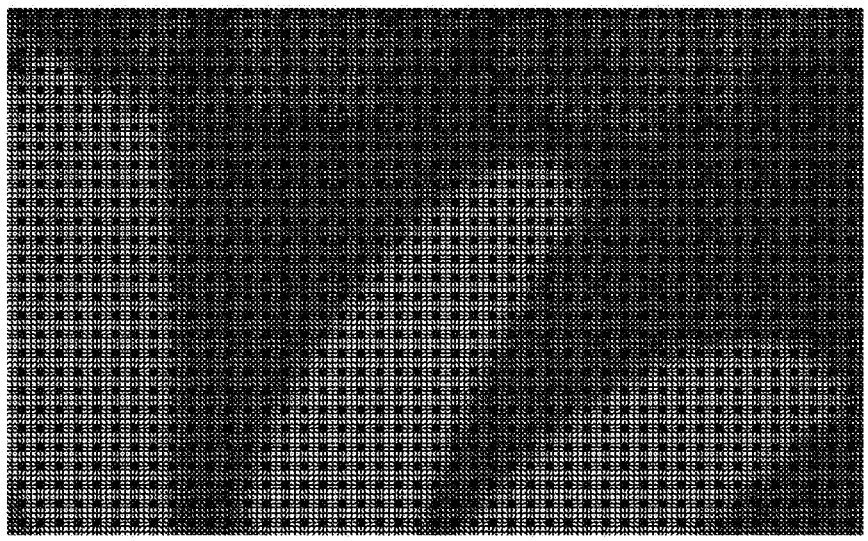
FIG. 8 is a natural image-superpixel simulation diagram of a display panel in accordance with some embodiments of the present disclosure.

FIG. 8 is a natural image-superpixel simulation diagram of the display panel 1000 shown in FIG. 5. It can be seen that, the details may be better presented in the natural image displayed on the display panel 1000.

In the display panel 1000 provided by some embodiments of the present disclosure, not only is the island region 10 provided with at least one first pixel 100, but at least one second pixel 200 is also arranged in at least one second region 202 of the plurality of second regions 202. In this way, when the display panel 1000 displays an image, not only can the first pixels 100 disposed in the island regions 10 emit light, but also the second pixel 200 disposed in the second region 202 can emit light, Therefore, an area available for display of the display panel 1000 may be increased. In addition, the display panel 1000 provided by the embodiments of the present disclosure may have more pixels. Therefore, the display panel 1000 may display a fuller image, and an influence of the screen door effect on the image may be improved. Of course, the continuity of the line pattern displayed on the display panel may be increased, and the details of an image may be better presented.

In some embodiments, as shown in FIGS. 9 and 10, the plurality of island regions 10 of the display panel 1000 are arranged in an array. The plurality of bridge regions 20 include a plurality of groups of bridge regions, and each group of bridge regions includes a first bridge region 21, a second bridge region 22, a third bridge region 23 and a fourth bridge region 24. That is, each group of bridge regions includes four bridge regions 20.

As shown in FIGS. 9 and 10, the island region 10 is directly connected to one second region 202 in the first bridge region 21, one second region 202 in the second bridge region 22, one second region 202 in the third bridge region 23, and one second region 202 in the fourth bridge region 24 in a corresponding group of bridge regions. The one second region 202 in the first bridge region 21 and the one second region 202 in the second bridge region 22 are located on opposite first and second sides of the island region 10, and the one second region 202 in the third bridge region 23 and the one second region 202 in the fourth bridge region 24 are located on opposite third and fourth sides of the island region 10.

For example, as shown in FIG. 9, as for the island region 10 at the center of this figure, one second region 202 in the first bridge region 21 and one second region in the second bridge region 22 are respectively located on two opposite sides of the island region 10 along a column direction of the plurality of island regions 10, and the two second regions 202 are directly connected to the island region 10. One second region 202 in the third bridge region 23 and one second region 202 in the fourth bridge region 24 are located on two opposite sides of the island region 10 along a row direction of the plurality of island regions 10, and the two second regions are directly connected to the island region 10.

For another example, as shown in FIG. 10, as for the island region 10 at the center of this figure, one second region 202 in the first bridge region 21 and one second region 202 in the second bridge region 22 are located on two opposite sides of the island region 10 along the row direction of the plurality of island regions 10, and the two second regions 202 are directly connected to the island region 10. One second region 202 in the third bridge region 23 and one second region 202 in the fourth bridge region 24 are located on two opposite sides of the island region 10 along the column direction of the plurality of island regions 10, and the two second regions are directly connected to the island region 10.

As shown in FIGS. 9 and 10, another second region 202 in the first bridge region 21 is directly connected to another island region 10 located at the first side of the island region 10 and closest to the island region 10 (i.e., adjacent to the island region 10). Another second region 202 in the second bridge region 22 is directly connected to another island region 10 located at the second side of the island region 10 and closest to the island region 10 adjacent to the island region 10). The island region 10, the another island region 10 located at the first side of the island region 10, and the another island region 10 located at the second side of the island region 10 are located in a same row of island regions 10.

The first bridge region 21 in the group of bridge regions is directly connected to two adjacent island regions 10 (hereinafter referred to as a first island region and a second island region for convenience of description) that are located in the same row of island regions 10. That is, one second region 202 in the first bridge region 21 is connected to the first island region, and the other second region 202 in the first bridge region 21 is connected to the second island region.

The second bridge region 22 in the group of bridge regions is directly connected to two adjacent island regions 10 (hereinafter referred to as the first island region and a third island region for convenience of description) that are located in the same row of island regions 10. That is, one second region 202 in the second bridge region 22 is connected to the first island region, and the other second region 202 in the second bridge region 22 is connected to the third island region.

For example, as shown in FIGS. 9 and 10, the first bridge region 21 in the group of bridge regions is directly connected to the first island region and the second island region that is adjacent to the first island region and located on a right side of the first island region. The second bridge region 22 is directly connected to the first island region and the third island region that is adjacent to the first island region and located on a left side of the first island region.

In addition, as shown in FIGS. 9 and 10, another second region 202 in the third bridge region 23 is directly connected to another island region 10 located at the third side of the island region 10 and closet to the island region 10 (i.e., adjacent to the island region 10). Another second region 202 in the fourth bridge region 24 is directly connected to another island region located at the fourth side of the island region 10 and closest to the island region 10 (i.e., adjacent to the island region 10). The island region 10, the another island region 10 located at the third side of the island region 10, and the another island region 10 located at the fourth side of the island region 10 are located in a same column of island regions.

The third bridge region 23 in the group of bridge regions is directly connected to two adjacent island regions 10 (hereinafter referred to as a fourth island region and a fifth island region for convenience of description) that are located in the same column of island regions 10. That is, one second region 202 in the third bridge region 23 is connected to the fourth island region, and the other second region 202 in the third bridge region 23 is connected to the fifth island region.

The fourth bridge region 24 in the group of bridge regions is directly connected to two adjacent island regions 10 (hereinafter referred to as the fourth island region and a sixth island region for convenience of description) that are located in the same column of island regions 10. That is, one second region 202 in the fourth bridge region 24 is connected to the fourth island region, and the other second region 202 in the fourth bridge region 24 is connected to the sixth island region.

For example, as shown in FIGS. 9 and 10, the third bridge region 23 in the group of bridge regions is directly connected to the fourth island region and the fifth island region that is adjacent to the fourth island region and located on an upper side the fourth island region. The fourth bridge region 24 is directly connected to the fourth island region and the sixth island region that is adjacent to the fourth island region and located on a lower side of the fourth island region.

It will be noted that, in order to clearly illustrate the bridge regions 20, the first pixels 100 and the second pixels 200 are not shown in FIGS. 9 and 10. In practice, each island region 10 is provided with at least one first pixel 100 therein, and at least one bridge region 20 is provided with at least one second pixel 200 therein.

Figure 11:
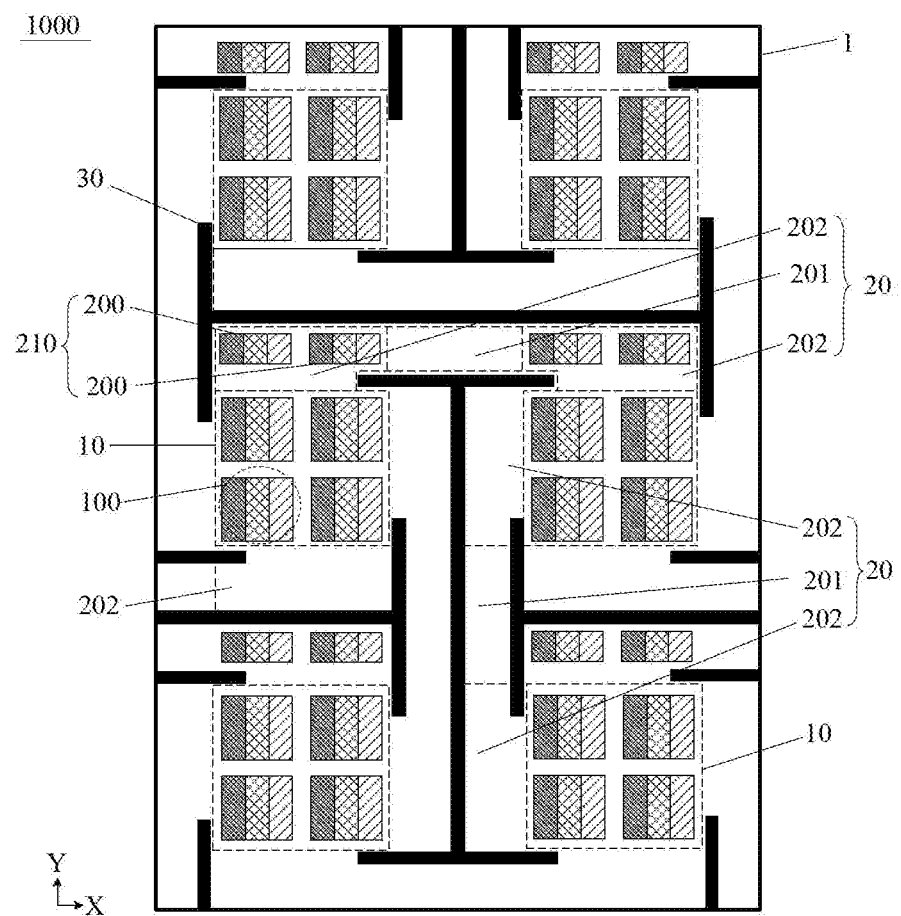
FIG. 11 is a top view of another display panel, in accordance with some embodiments of the present disclosure.

In some embodiments, as shown in FIG. 11, the island region 10 is provided with a plurality of first pixels 100 arranged in M rows by N columns therein. One of M and N is an integer greater than or equal to 1, and another is an integer greater than or equal to 2. For example, each island region 10 is provided with a plurality of first pixels 100 arranged in the M rows by the N columns therein. In this way, the plurality of first pixels 100 of the M rows by the N columns are arranged in a matrix, and thus the light emission of the display panel 1000 may be more uniform.

In some examples, M and N are both integers greater than or equal to 2. For example, as shown in FIG. 11, both M and N are 2. That is, the plurality of first pixels 100 in the island region 10 are arranged in an array of 2 by 2.

Figure 12:
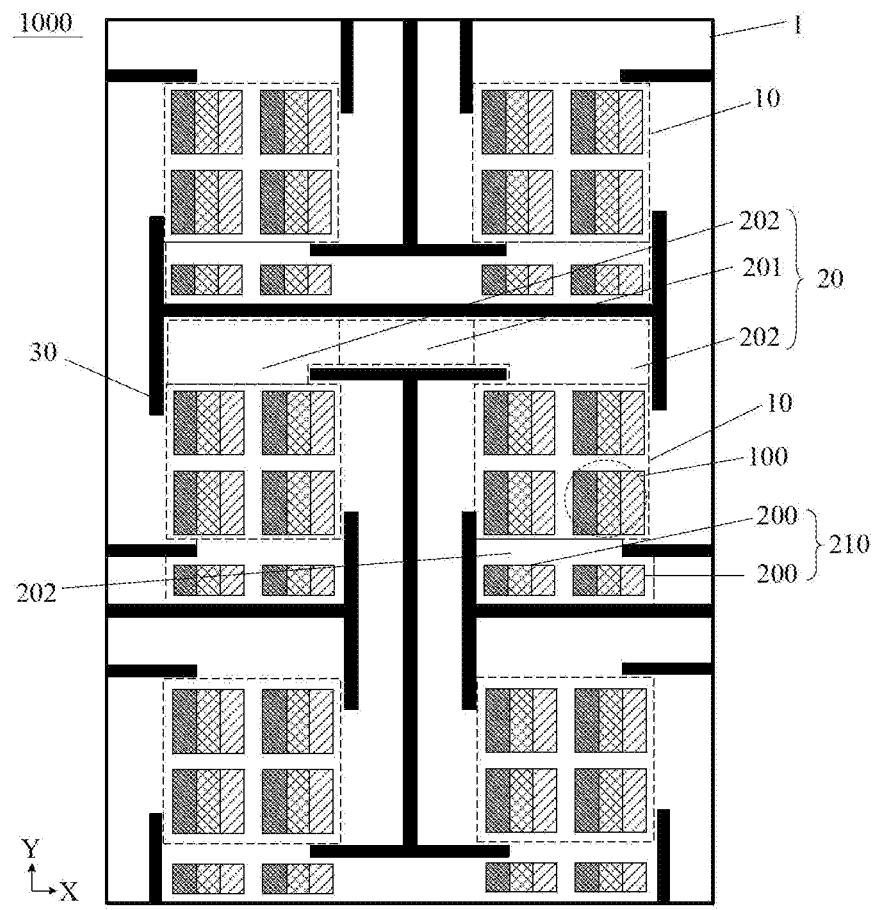
FIG. 12 is a top view of yet another display panel, in accordance with some embodiments of the present disclosure.
Figure 13:
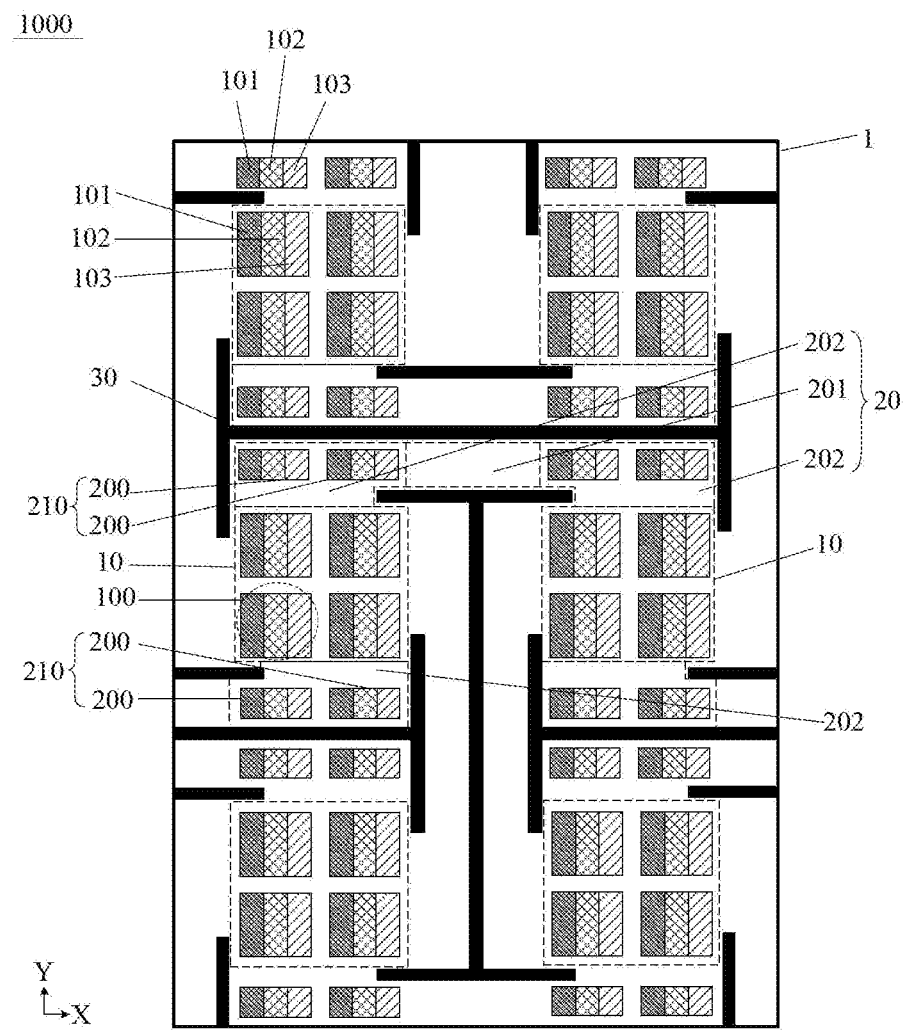
FIG. 13 is a top view of yet another display panel, in accordance with some embodiments of the present disclosure.

In some embodiments, as shown in FIGS. 11 to 13, the display panel 1000 includes a plurality of second pixels 200. In this case, the arrangement of the plurality of second pixels 200 may have the following implementations.

In some examples, as shown in FIG. 11, a first pixel group 210 including two or more second pixels 200 is arranged in a first second region 202 located on a side of first pixels 100 in a first row in the island region 10 away from first pixels 100 in an M-th row. The two or more second pixels 200 are arranged along a first direction X parallel to a row direction of the plurality of first pixels 100 (i.e., a row direction of the plurality of island regions 10).

For example, as shown in FIG. 11, the plurality of first pixels 100 in the island region 10 are arranged in an array of 2 by 2 (i.e., M=2, N=2). A first pixel group 210 including two second pixels 200 is arranged in a second region 202 located on a side of first pixels 100 in the first row in the island region 10 away from first pixels 100 in a second row, and the two second pixels 200 are arranged along the first direction X.

In some other examples, as shown in FIG. 12, a first pixel group 210 including two or more second pixels 200 is arranged in a second second region 202 located on a side of first pixels 100 in the M-th row in the island region 10 away from first pixels 100 in the first row. The two or more second pixels 200 are arranged along the first direction X.

For example, as shown in FIG. 12, the plurality of first pixels 100 in the island region 10 are arranged in an array of 2 by 2 (i.e., M=2, N=2). A first pixel group 210 including two second pixels 200 is arranged in a second region 202 located on a side of first pixels 100 in a second row in the island region 10 away from first pixels 100 in a first row, and the two second pixels 200 are arranged along the first direction X.

In some other examples, as shown in FIG. 13, a first pixel group 210 including two or more second pixels 200 is arranged in the first second region 202 located on the side of first pixels 100 in the first row in the island region 10 away from first pixels 100 in the M-th row, and another first pixel group 210 including two or more second pixels 200 is arranged in the second second region 202 located on the side of first pixels 100 in the M-th row in the island region 10 away from first pixels 100 in the first row. The two or more second pixels 200 in the first pixel group 210 are arranged along the first direction X, and the two or more second pixels 200 in the another first pixel group 210 are arranged along the first direction X.

For example, as shown in FIG. 13, the plurality of first pixels 100 in the island region 10 are arranged in an array of 2 by 2 (i.e., M=2, N=2). A first pixel group 210 including two second pixels 200 is arranged in the second region 202 located on the side of first pixels 100 in the first row in the island region 10 away from first pixels 100 in the second row, and another first pixel group 210 including two second pixels 200 is arranged in another second region 202 located on the side of first pixels 100 in the second row in the island region 10 away from first pixels 100 in the first row. The two second pixels 200 in the first pixel group 210 are arranged along the first direction X, and the two second pixels 200 in the another first pixel group 210 are also arranged along the first direction X.

As for the first second region 202 located on the side of first pixels 100 in the first row in the island region 10 away from first pixels 100 in the M-th row and the second second region 202 located on the side of first pixels 100 in the M-th row in the island region 10 away from first pixels 100 in the first row (i.e., the second regions 202 located on upper and lower sides of the island region 10 shown in FIG. 13), the length of each second region 202 along the first direction X may be greater than the width thereof along the column direction of the plurality of first pixels 100 (i.e., the second direction Y).

In some embodiments, a region where each second pixel 200 in the first pixel group 210 is located and regions where a column of first pixels 100 in the adjacent island region 10 are located are arranged in a direction perpendicular to the first direction X (i.e., the second direction Y).

In some examples, the plurality of second pixels 200 in the first pixel group 210 include N second pixels 200, and a region where each second pixel 200 of the N second pixels 200 is located and regions where a corresponding column of first pixels 100 are located are arranged in the second direction Y. For example, as shown in FIGS. 11 to 13, the plurality of second pixels 200 in the first pixel group 210 include two second pixels 200, and a region where one second pixel 200 of the two second pixels 200 is located and regions where a first column of first pixels 100 are located are arranged in the second direction Y. A region where another second pixel 200 of the two second pixels 200 is located and regions where a second column of first pixels 100 are located are also arranged in the second direction Y.

In some examples, a geometric center of each second pixel 200 in the first pixel group 210 is in a same straight line as geometric centers of the first pixels in a corresponding column. In this way, a display uniformity of the display panel may be improved.

In some embodiments, a length of the second pixel 200 in the first pixel group 210 in the first direction X is equal to a length of the first pixel 100 in the corresponding column in the first direction X. In this way, it may further ensure a uniformity of light emitted by the display panel 1000.

A width of each second pixel 200 in the first pixel group 210 along the second direction Y is determined depending on a width of the second region 202 where the first pixel group 210 is located along the second direction Y.

In some embodiments, as shown in FIG. 13, each of the second pixel 200 in the first pixel group 210 and the first pixel 100 includes a first color sub-pixel 101, a second color sub-pixel 102 and a third color sub-pixel 103 that are sequentially arranged along the first direction X. The first color sub-pixel 101, the second color sub-pixel 102 and the third color sub-pixel 103 are configured to emit light of three primary colors. For example, the first color sub-pixel 101, the second color sub-pixel 102 and the third color sub-pixel 103 emit red light, green light and blue light, respectively.

In some examples, lengths of the first color sub-pixel 101, the second color sub-pixel 102 and the third color sub-pixel 103 in the first direction X are equal. That is, each sub-pixel in the first pixel has the same length as each sub-pixel in the second pixel. For example, the first color sub-pixel 101, the second color sub-pixel 102 and the third color sub-pixel 103 in the second pixel 200 are in one-to-one correspondence with the first color sub-pixel 101, the second color sub-pixel 102 and the third color sub-pixel 103 in a first pixel 100 in the same column as the second pixel 200, and the lengths of the first color sub-pixels 101, the second color sub-pixels 102 and the third color sub-pixels 103 in the first direction X are equal. In this way, it may be ensured that geometric centers of sub-pixels of the same color in the second pixel 200 and the first pixel 100 are in the same straight line, so that a problem of color mixture may not occur between light of two different colors emitted by two adjacent sub-pixels of different colors.

For example, each of the first pixel 100 and the second pixel 200 in the first pixel group 210 includes a red sub-pixel, a green sub-pixel, and a blue sub-pixel. With respect to the first column of first pixels 100 in the island region 10, geometric centers of the red sub-pixels in the first column of first pixels 100 and geometric centers of the red sub-pixels of the second pixel 200 corresponding to the first column of first pixels 100 are in the same straight line. Geometric centers of the green sub-pixels in the first column of first pixels 100 and geometric centers of the green sub-pixels of the second pixel 200 corresponding to the first column of first pixels 100 are in the same straight line. Geometric centers of the blue sub-pixels in the first column of first pixels 100 and geometric centers of the blue sub-pixels of the second pixel 200 corresponding to the first column of first pixels 100 are in the same straight line. In this way, the red light emitted by the red sub-pixels may not be mixed with the green light emitted by the green sub-pixels, and the green light emitted by the green sub-pixels may not be mixed with the blue light emitted by the blue sub-pixels either. Therefore, it may be ensured that the problem of color mixture will not occur among light emitted by pixels in the island region 10 and the second regions 202 connected to the island region 10.

In some other embodiments, as shown in FIGS. 14 to 16C, the display panel 1000 includes a plurality of second pixels 200. In this case, the arrangement of the plurality of second pixels 200 may further have the following implementations.

Figure 14:
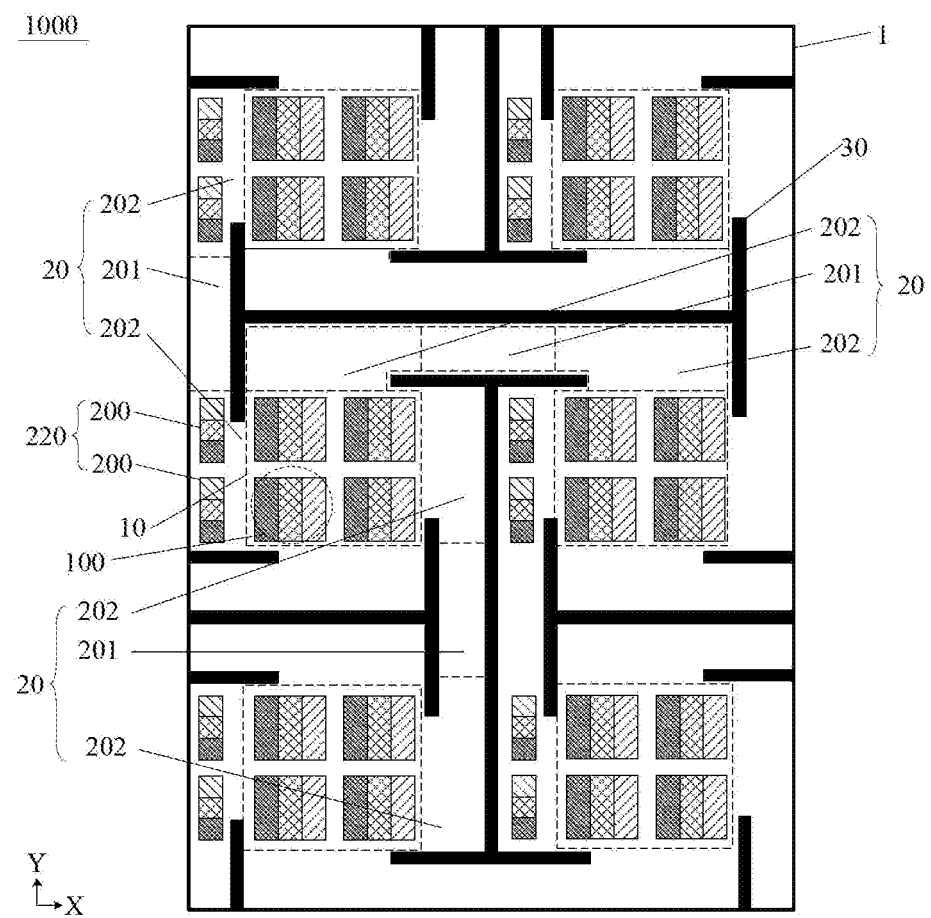
FIG. 14 is a top view of yet another display panel, in accordance with some embodiments of the present disclosure.

In some examples, as shown in FIG. 14, a second pixel group 220 including two or more second pixels 200 is arranged in a third second region 202 located on a side of first pixels 100 in a first column in the island region 10 away from first pixels 100 in an N-th column. The two or more second pixels 200 are arranged along a second direction Y parallel to the column direction of the plurality of first pixels 100 (i.e., the column direction of the plurality of island regions 10).

For example, as shown in FIG. 14, the plurality of first pixels 100 in the island region 10 are arranged in an array of 2 by 2 (i.e., m=2, N=2). A second pixel group 220 including two second pixels 200 is arranged in a second region 202 located on a side of first pixels 100 in the first column in the island region 10 away from first pixels 100 in the second column, and the two second pixels 200 are arranged along the second direction Y.

Figure 15:
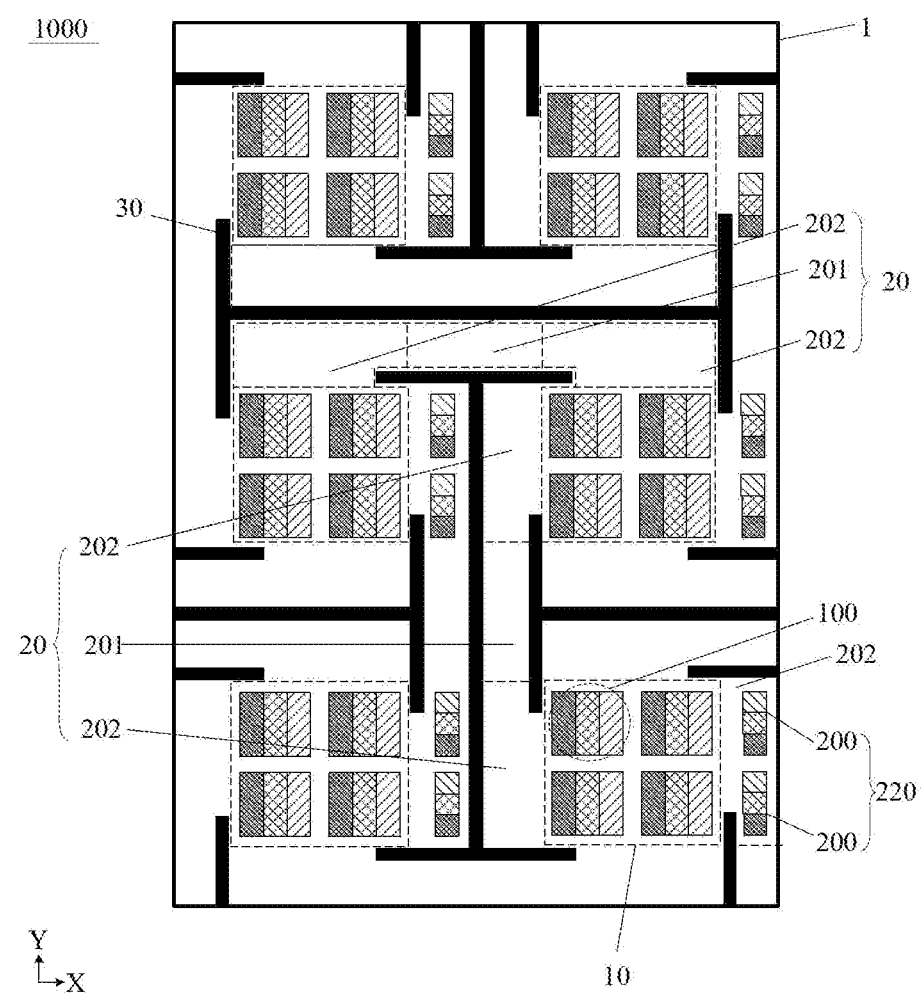
FIG. 15 is a top view of yet another display panel, in accordance with some embodiments of the present disclosure.

In some other examples, as shown in FIG. 15, a second pixel group 220 including two or more second pixels 200 is arranged in a fourth second region 202 located on a side of first pixels 100 in the N-th column in the island region 10 away from the first pixels 100 in the first column. The two or more second pixels 200 are arranged along the second direction Y.

For example, as shown in FIG. 15, the plurality of first pixels 100 in the island region 10 are arranged in an array of 2 by 2 m=2, N=2). A second pixel group 220 including two pixels 200 is arranged in a second region 202 located on a side of first pixels 100 in the second column in the island region 10 away from first pixels 100 in the first column, and the two second pixels 200 are arranged along the second direction Y.

Figure 16A:
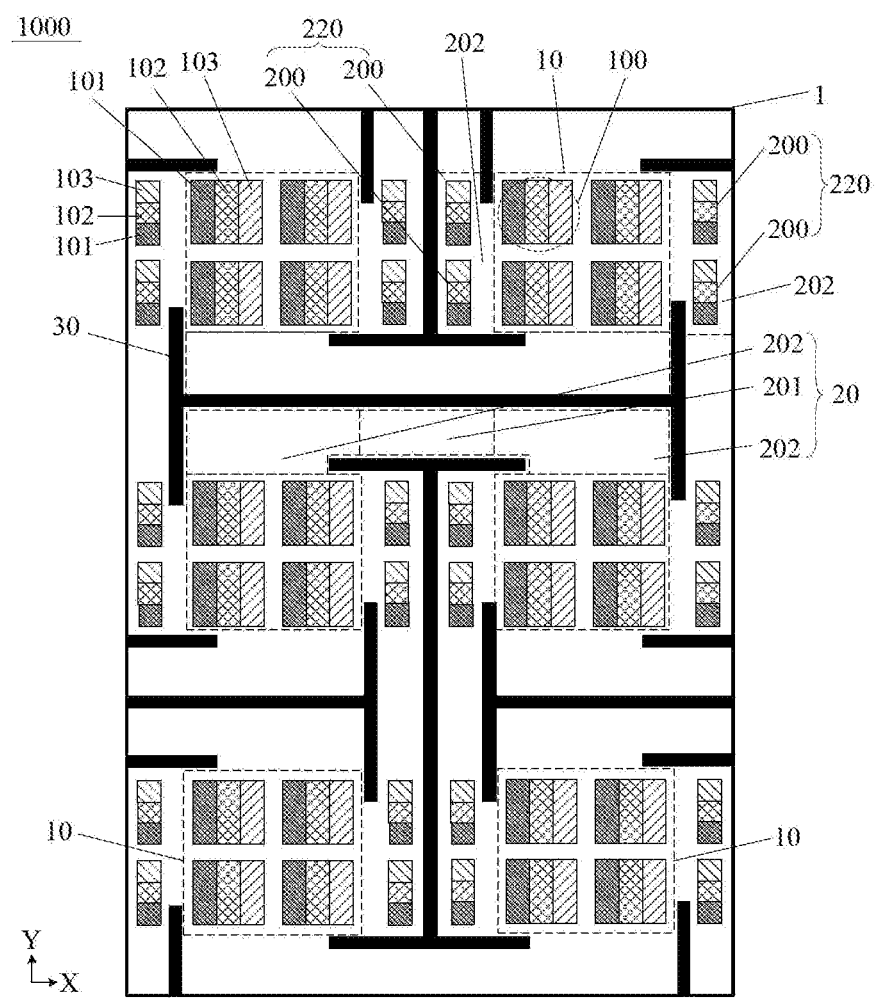
FIG. 16A is a top view of yet another display panel, in accordance with some embodiments of the present disclosure.
Figure 16B:
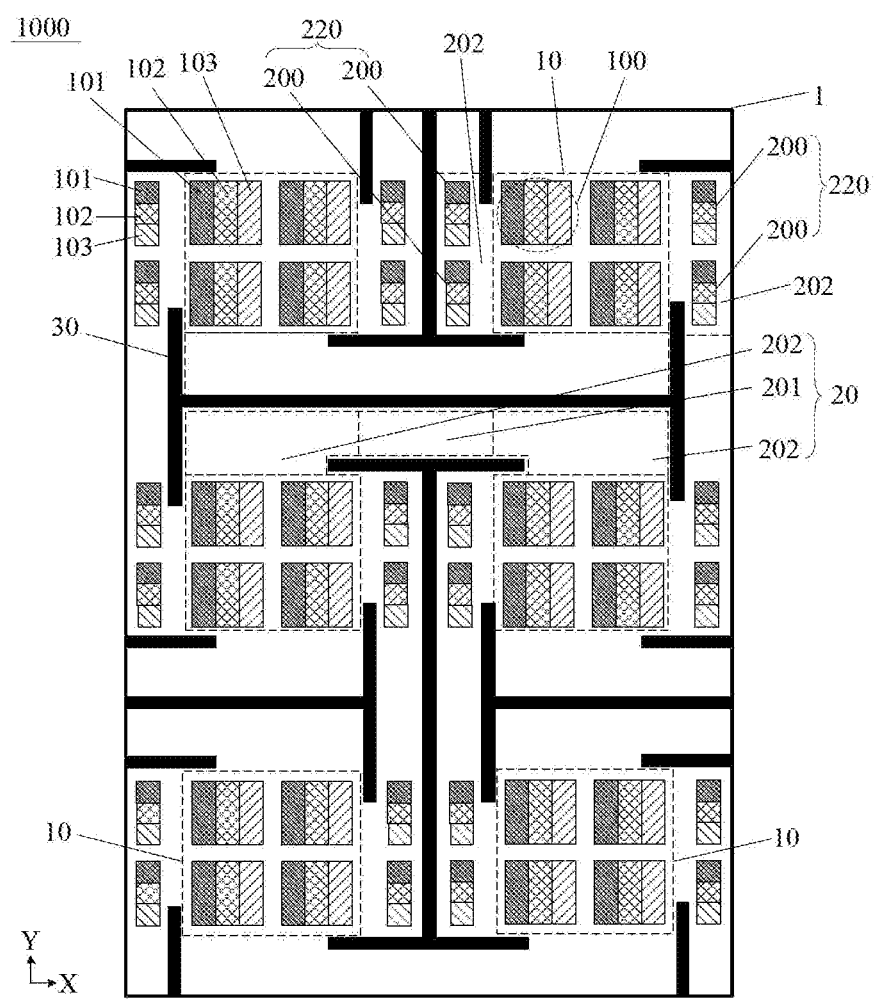
FIG. 16B is a top view of yet another display panel, in accordance with some embodiments of the present disclosure.
Figure 16C:
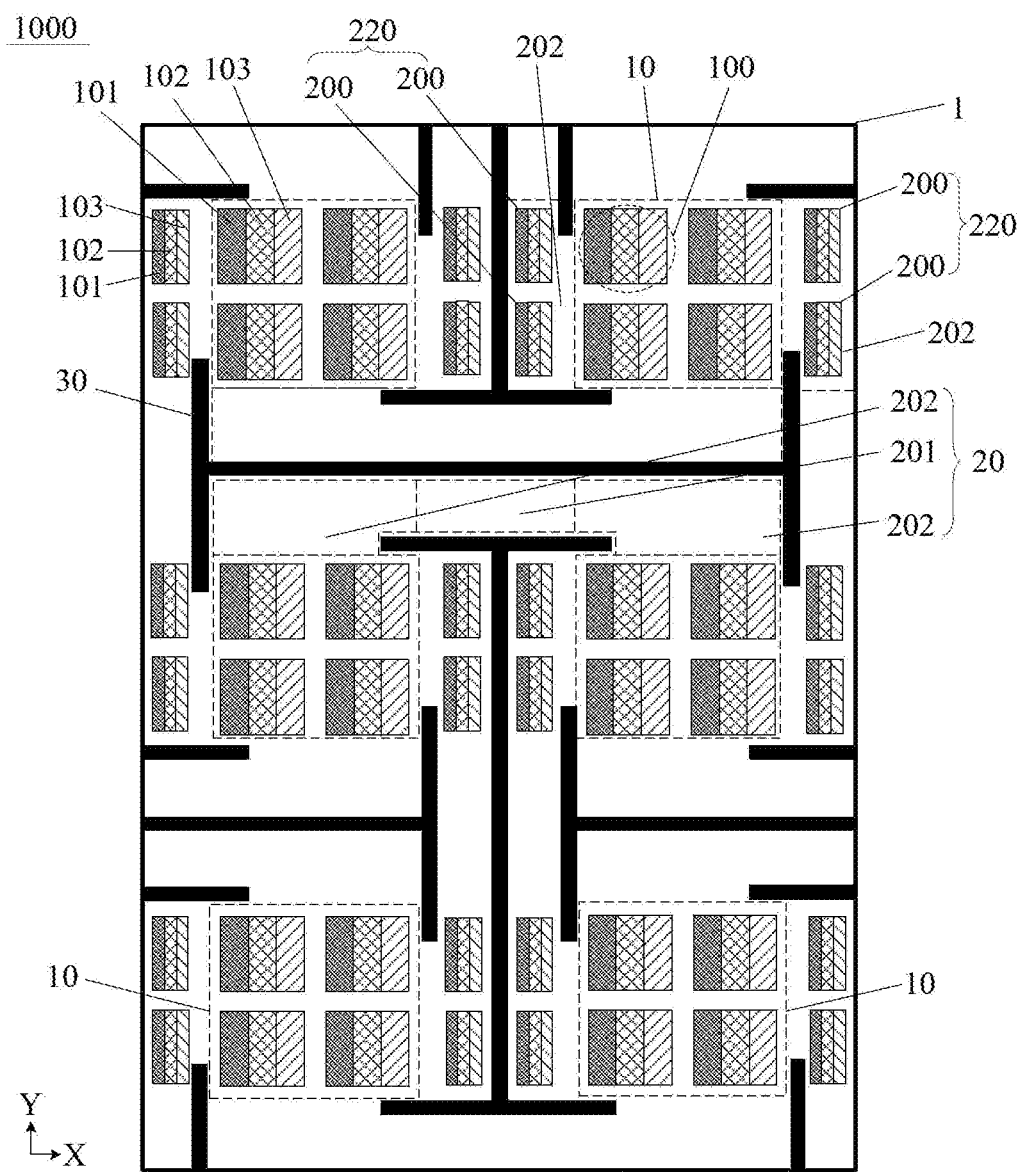
FIG. 16C is a top view of yet another display panel, in accordance with some embodiments of the present disclosure.

In some other examples, as shown in FIGS. 16A to 16C, a second pixel group 220 including two or more second pixels 200 is arranged in the third second region 202 located on the side of first pixels 100 in the first column in the island region 10 away from first pixels 100 in the N-th column, and another second pixel group 220 including two or more second pixels 200 is arranged in the fourth second region 202 located on the side of first pixels 100 in the N-th column in the island region 10 away from first pixels 100 in the first column. The two or more second pixels 200 in the second pixel group 220 are arranged along the second direction Y, and the two or more second pixels 200 in the another second pixel group 220 are arranged along the second direction Y.

For example, as shown in FIGS. 16A to 16C, the plurality of first pixels 100 in the island region 10 are arranged in an array of 2 by 2 (i.e., M=2, N=2). A second pixel group 220 including two second pixels 200 is arranged in a second region 202 located on a side of first pixels 100 in a first column in the island region 10 away from first pixels 100 in a second column, and another second pixel group 220 including two second pixels 200 is arranged in another second region 202 located on a side of first pixels 100 in the second column in the island region 10 away from first pixels 100 in the first column. The two second pixels 200 in the second pixel group 220 are arranged along the second direction Y, and the two second pixels 200 in the another second pixel group 220 are also arranged along the second direction Y.

As for the third second region 202 located on the side of first pixels 100 in the first column in the island region 10 away from first pixels 100 in the N-th column and the fourth second region 202 located on the side of first pixels 100 in the N-th column in the island region 10 away from first pixels 100 in the first column (i.e., the second regions 202 located on left and right sides of the island region 10 shown in FIGS. 16A and 16B), the width of each second region 202 along the second direction Y may be greater than the length thereof in the row direction of the plurality of first pixels 100 (i.e., the first direction X).

In some embodiments, a region where each second pixel 200 in the second pixel group 220 is located and regions where a row of first pixels 100 in the adjacent island region 10 are located are arranged in a direction perpendicular to the second direction Y (i.e., the first direction X).

In some examples, the plurality of second pixels 200 in the second pixel group 220 include M second pixels 200, and a region where each second pixel 200 of the M second pixels 200 is located and regions where a corresponding row of first pixels 100 are located are arranged in the first direction X. For example, as shown in FIGS. 14 to 16A, the plurality of second pixels 200 in the second pixel group 220 include two second pixels 200, and a region where one of the two second pixels 200 is located and regions where first pixels 100 in a first row are located are arranged in the first direction X. A region where another of the two second pixels 200 is located and regions where first pixels 100 in a second row are located are arranged in the first direction X.

In some examples, a geometric center of each second pixel 200 in the second pixel group 220 is in a same straight line as geometric centers of the first pixels 100 in a corresponding row. In this way, the display uniformity of the display panel may be improved.

In some embodiments, a width of the second pixel 200 in the second pixel group 220 in the second direction Y is equal to a width of the first pixel 100 in the corresponding row in the second direction Y. In this way, it may further ensure the uniformity of light emitted by the display panel 1000.

A length of each second pixel 200 in the second pixel group 220 along the first direction X is determined depending on a length of the second region 202 where the second pixel group 220 is located along the first direction X.

In some embodiments, as shown in FIGS. 16A to 16O, each of the second pixel 200 in the second pixel group 220 and the first pixel 100 includes a first color sub-pixel 101, a second color sub-pixel 102 and a third color sub-pixel 103. The first color sub-pixel 101, the second color sub-pixel 102 and the third color sub-pixel 103 are configured to emit light of three primary colors. For example, the first color sub-pixel 101, the second color sub-pixel 102 and the third color sub-pixel 103 emit red light, green light and blue light, respectively.

In some examples, as shown in FIGS. 16A to 16C, the first color sub-pixel 101, the second color sub-pixel 102 and the third color sub-pixel 103 in the first pixel 100 are arranged along the first direction X. The first color sub-pixel 101, the second color sub-pixel 102 and the third color sub-pixel 103 in the second pixel 200 are arranged along the second direction Y or along the first direction X.

For example, a direction along which the first color sub-pixel 101, the second color sub-pixel 102 and the third color sub-pixel 103 of the second pixel 200 in the second pixel group 220 are arranged may be determined depending on the length of the second region 202 where the second pixel group 220 is located along the first direction X. In a case where a size of the second region 202 where the second pixel group 220 is located along the first direction X is sufficient to accommodate the first color sub-pixel 101, the second color sub-pixel 102 and the third color sub-pixel 103, as shown in FIG. 16C, the first color sub-pixel 101, the second color sub-pixel 102 and the third color sub-pixel 103 of the second pixel 200 in the second pixel group 220 may be arranged along the first direction X. In a case where the size of the second region 202 where the second pixel group 220 is located along the first direction X is insufficient to accommodate the first color sub-pixel 101, the second color sub-pixel 102 and the third color sub-pixel 103, as shown in FIGS. 16A and 16B, the first color sub-pixel 101, the second color sub-pixel 102 and the third color sub-pixel 103 of the second pixel 200 in the second pixel group 220 may be arranged along the second direction Y.

In some examples, as shown in FIG. 16A, the first color sub-pixel 101, the second color sub-pixel 102 and the third color sub-pixel 103 of the second pixel 200 in the second pixel group 220 are arranged along the second direction Y, and the first color sub-pixel 101, the second color sub-pixel 102 and the third color sub-pixel 103 are sequentially arranged along a direction from first pixels 100 in the M-th row in the island region 10 to first pixels 100 in the first row. For example, as shown in FIG. 16A, the first color sub-pixel 101, the second color sub-pixel 102 and the third color sub-pixel 103 of the second pixel 200 in the second pixel group 220 are arranged along the second direction Y, and the first color sub-pixel 101, the second color sub-pixel 102 and the third color sub-pixel 103 are sequentially arranged along a direction from first pixels 100 in the second row in the island region 10 to first pixels 100 in the first row.

In some other examples, as shown in FIG. 16B, the first color sub-pixel 101, the second color sub-pixel 102 and the third color sub-pixel 103 of the second pixel 200 in the second pixel group 220 are arranged along the second direction Y, and the first color sub-pixel 101, the second color sub-pixel 102 and the third color sub-pixel 103 are sequentially arranged along a direction from first pixels 100 in the first row in the island region 10 to first pixels 100 in the M-th row. For example, as shown in FIG. 16B, the first color sub-pixel 101, the second color sub-pixel 102 and the third color sub-pixel 103 of the second pixel 200 in the second pixel group 220 are arranged along the second direction Y, and the first color sub-pixel 101, the second color sub-pixel 102 and the third color sub-pixel 103 are sequentially arranged along a direction from first pixels 100 in the first row in the island region 10 to first pixels 100 in the second row.

In some other embodiments, as shown in FIG. 5, the display panel 1000 includes a plurality of second pixels 200. The arrangement of the plurality of second pixels 200 may be as follows: a first pixel group 210 including two or more second pixels 200 is arranged in the first second region 202 located on the side of first pixels 100 in the first row in the island region 10 away from first pixels 100 in the M-th row, and another first pixel group 210 including two or more second pixels 200 is arranged in the second second region 202 located on the side of first pixels 100 in the M-th row in the island region 10 away from first pixels 100 in the first row. A second pixel group 220 including two or more second pixels 200 is arranged in the third second region 202 located on the side of first pixels 100 in the first column in the island region 10 away from first pixels 100 in the N-th column, and another second pixel group 220 including two or more second pixels 200 is arranged in the fourth second region 202 located on the side of first pixels 100 in the N-th column in the island region 10 away from first pixels 100 in the first column. With regard to other details about the plurality of second pixels 200, reference may be made to the aforementioned two embodiments, which will not be repeated here.

Some embodiments of the present disclosure provide a display apparatus, which includes at least one display panel 1000 as described above.

Figure 17:
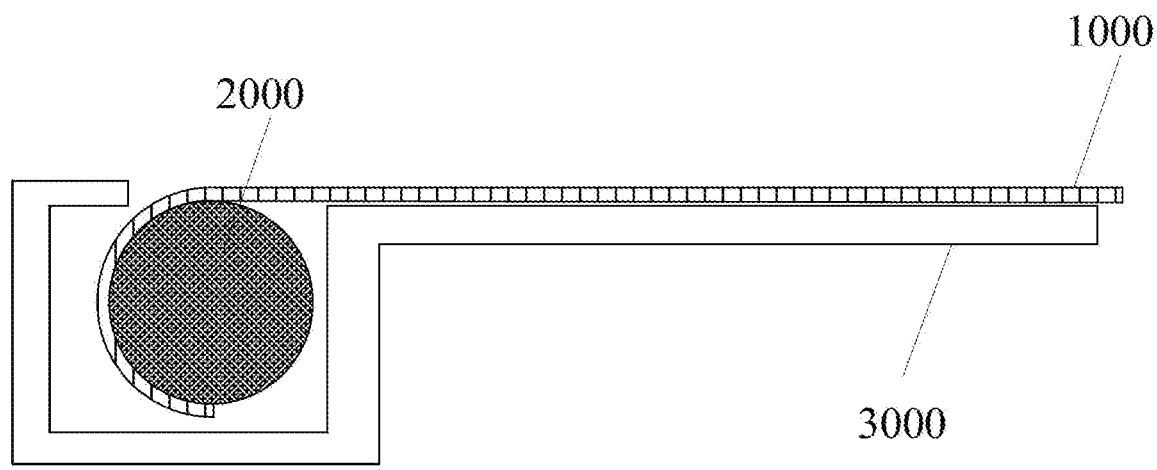
FIG. 17 is a schematic diagram illustrating a stretching method of a display apparatus, in accordance with some embodiments of the present disclosure.

In some embodiments, as shown in FIG. 17, the at least one display panel 1000 in the display apparatus includes one display panel 1000. The display apparatus further includes a reel 2000, and one edge of the display panel 1000 is fixed to the reel 2000. In this case, the display panel 1000 is rollable around the reel 2000 and is expandable. In this way, the display panel 1000 may be expanded by applying a pulling force to an end of the display panel 1000 away from the reel 2000 and may also be rolled up.

As shown in FIG. 17, the display apparatus may further include a flexible housing 3000 for supporting the display panel 1000 and receiving the reel 2000. For example, as shown in FIG. 17, the flexible housing 3000 has a groove, and the reel 2000 is disposed in the groove and may rotate about its axis.

Figure 18:
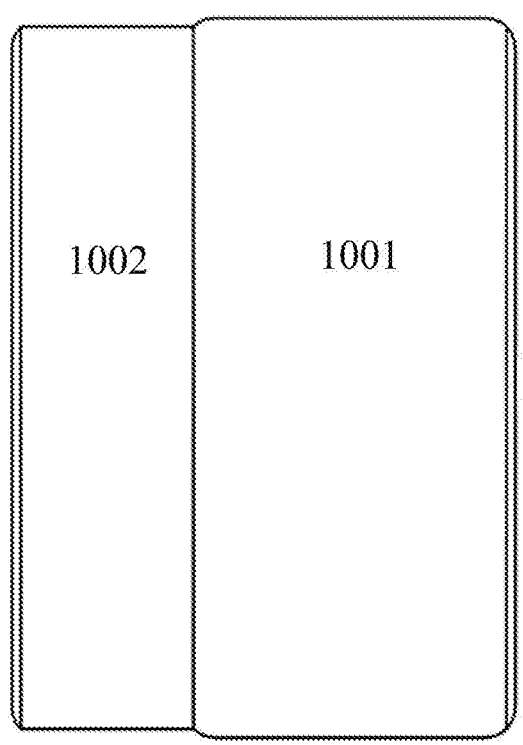
FIG. 18 is a schematic diagram illustrating a stretching method of another display apparatus, in accordance with some embodiments of the present disclosure.

In some other embodiments, as shown in FIG. 18, the at least one display panel 1000 in the display apparatus includes two display panels 1000, and one of the display panels 1000 is configured to translate relative to another display panel 1000.

Figure 19:
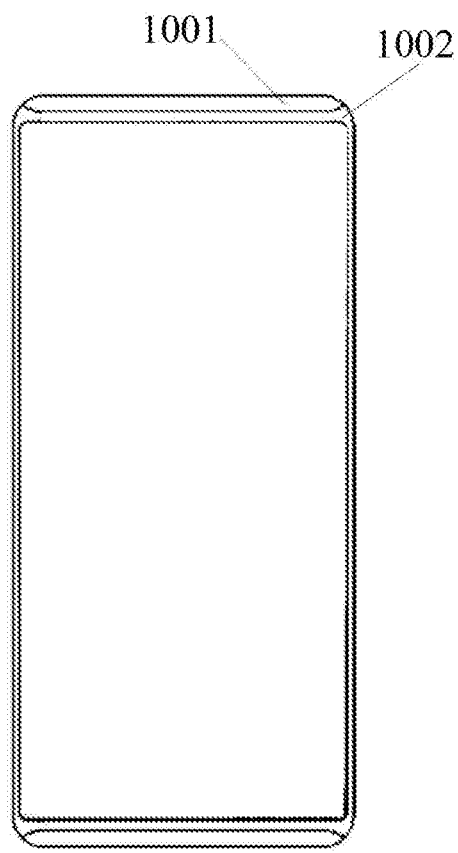
FIG. 19 is a structural diagram illustrating a display apparatus in a first display state, in accordance with some embodiments of the present disclosure.
Figure 20:
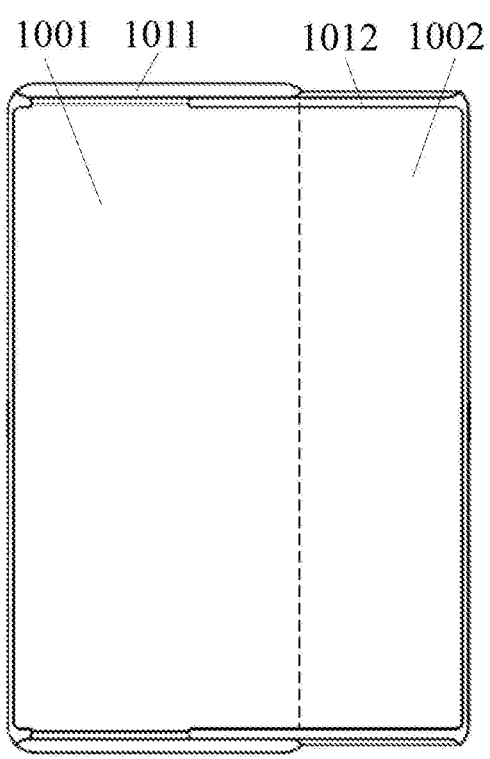
FIG. 20 is a structural diagram illustrating a display apparatus in a second display state, in accordance with some embodiments of the present disclosure.

There are various ways to realize relative translation of the two display panels 1000. In some examples, as shown in FIGS. 18 to 20, the two display panels 1000 include a first display panel 1001 and a second display panel 1002. The display apparatus further includes sliding guide rails 1011 disposed on two opposite sides of the first display panel 1001, and sliders 1012 disposed on two opposite sides of the second display panel 1002. Each slider 1012 is arranged in a corresponding sliding guide rail 1011 and slidably connected to the corresponding sliding guide rail 1011. In this way the second display panel 1002 may move relative to the first display panel 1001 under the action of the pulling force.

The display apparatus may be any product or component having a display function, such as a mobile phone, a tablet, computer, a television, a display, a notebook computer, a digital photo frame, or a navigator.

FIG. 18 shows an example where the display apparatus is a smart phone. As shown in FIG. 18, the smart phone includes a first display panel 1001 and a second display panel 1002. Sliding guide rails 1011 are provided on two opposite sides of the first display panel 1001, and sliders 1012 are provided on two opposite sides of the second display panel 1002. By sliding the sliders 1012, the second display panel 1002 may be made to slide along the sliding guide rails 1011 on a side frame of the first display panel 1001.

The smart phone described above has a first display mode shown in FIG. 19 and a second display mode shown in FIG. 20. As shown in FIG. 19, when the smart phone is in the first display mode, the second display panel 1002 is received in the first display panel 1001, and the display panel of the smart phone has a relatively small area. As shown in FIG. 20, when the smart phone is in the second display mode, the second display panel 1002 extends out from the first display panel 1001, so that the second display panel 1002 and the first display panel 1001 constitute one display panel with a relatively large area.

The display panel of the smart phone may to be stretched during use. The display panel included in a stretchable display apparatus represented by the smart phone described above is provided with multiple groups of openings, so as to ensure that the pulling force will not cause damage to the display panel when the display is stretched.

The beneficial effects of the display apparatus provided in some embodiments of the present disclosure are the same as the beneficial effects of the display panel described in the above embodiments, and details will not be repeated herein.

In the description of the above embodiments, specific features, structures, materials, or characteristics may be combined in any suitable manner in any one or more embodiments or examples.

The forgoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display panel, comprising:
   a base, having a plurality of island regions spaced apart and a plurality of bridge regions connecting the plurality of island regions, each bridge region including a first region and two second regions disposed on two opposite sides of the first region, and each second region being directly connected to a corresponding one of the plurality of island regions; the base including a plurality of openings, and each opening being disposed between two adjacent bridge regions;
   a plurality of first pixels disposed on the base, each island region being provided with at least one first pixel therein; and
   at least one second pixel disposed in at least one of second regions of the plurality of bridge regions on the base.

2. The display panel according to claim 1, wherein the at least one first pixel includes a plurality of first pixels arranged in M rows by N columns in an island region, one of M and N is an integer greater than or equal to 1, and another is an integer greater than or equal to 2.

3. The display panel according to claim 2, wherein M and N are both integers greater than or equal to 2.

4. The display panel according to claim 3, wherein the at least one second pixel includes a plurality of second pixels;
a first second region in the plurality of bridge regions is disposed on a side of first pixels in a first row in the island region away from first pixels in an M-th row, and a second second region in the plurality of bridge regions is disposed on a side of the first pixels in the M-th row in the island region away from the first pixels in the first row;
at least one of the first second region and the second second region is provided with a first pixel group including two or more second pixels therein, and the two or more second pixels are arranged along a first direction parallel to a row direction of the plurality of first pixels.

5. The display panel according to claim 4, wherein a region where each second pixel in the first pixel group is located and regions where a column of first pixels in an adjacent island region are located are arranged in a direction perpendicular to the first direction; and
a geometric center of each second pixel in the first pixel group is in a same straight line as geometric centers of the first pixels in the column in the adjacent island region.

6. The display panel according to claim 5, wherein a length of the second pixel in the first pixel group in the first direction is equal to a length of one of the first pixels in the column in the first direction.

7. The display panel according to claim 6, wherein each of the second pixel in the first pixel group and the first pixels in the column includes a first color sub-pixel, a second color sub-pixel and a third color sub-pixel that are sequentially arranged along the first direction; and
lengths of the first color sub-pixel, the second color sub-pixel and the third color sub-pixel in the first direction are equal.

8. The display panel according to claim 3, wherein the at least one second pixel includes a plurality of second pixels;
a third second region in the plurality of bridge regions is disposed on a side of first pixels in a first column in the island region away from first pixels in an N-th column, and a fourth second region in the plurality of bridge regions is disposed on a side of the first pixels in the N-th column in the island region away from the first pixels in the first column;
at least one of the third second region and the fourth second region is provided with a second pixel group including two or more second pixels therein, and the two or more second pixels are arranged along a second direction parallel to a column direction of the plurality of first pixels.

9. The display panel according to claim 8, wherein a region where each second pixel in the second pixel group is located and regions where a row of first pixels in an adjacent island region are located are arranged in a direction perpendicular to the second direction; and
a geometric center of each second pixel in the second pixel group is in a same straight line as geometric centers of the first pixels in the row in the adjacent island region.

10. The display panel according to claim 9, wherein a width of the second pixel in the second pixel group in the second direction is equal to a width of one of the first pixels in the row in the second direction.

11. The display panel according to claim 10, wherein each of the second pixel in the second pixel group and the first pixels in the row includes a first color sub-pixel, a second color sub-pixel and a third color sub-pixel; and
the first color sub-pixel, the second color sub-pixel and the third color sub-pixel in each first pixel in the row are arranged along a first direction parallel to a row direction of the plurality of first pixels; and
the first color sub-pixel, the second color sub-pixel and the third color sub-pixel in the second pixel are arranged along the second direction or along the first direction.

12. The display panel according to claim 11, wherein the first color sub-pixel, the second color sub-pixel and the third color sub-pixel in the second pixel are arranged along the second direction;
the first color sub-pixel, the second color sub-pixel and the third color sub-pixel are sequentially arranged along a direction from first pixels in an M-th row in the island region to first pixels in a first row; or,
the first color sub-pixel, the second color sub-pixel and the third color sub-pixel are sequentially arranged along a direction from the first pixels in the first row in the island region to the first pixels in the M-th row.

13. The display panel according to claim 8, wherein a first second region in the plurality of bridge regions is disposed on a side of first pixels in a first row in the island region away from first pixels in an M-th row, and a second second region in the plurality of bridge regions is disposed on a side of the first pixels in, the M-th row in the island region away from the first pixels in the first row;
at least one of the first second region and the second second region is provided with a first pixel group including two or more second pixels therein, and the two or more second pixels are arranged along a first direction parallel to a row direction of the plurality of first pixels.

14. The display panel according to claim 1, wherein the plurality of island regions are arranged in an array;
the plurality of bridge regions include a plurality of groups of bridge regions, and each group of bridge regions includes a first bridge region, a second bridge region, a third bridge region and a fourth bridge region;
each island region is directly connected to one second region in a first bridge region, one second region in a second bridge region, one second region in a third bridge region, and one second region in a fourth bridge region in a corresponding group of bridge regions; the one second region in the first bridge region and the one second region in the second bridge region are disposed on opposite first and second sides of the island region, and the one second region in the third bridge region and the one second region in the fourth bridge region are disposed on opposite third and fourth sides of the island region;
another second region in the first bridge region is directly connected to one of the plurality of island regions located at the first side of the island region and closest to the island region, and another second region in the second bridge region is directly connected to one of the plurality of island regions located at the second side of the island region and closest to the island region; the island region, the one of the plurality of island regions located at the first side of the island region, and the one of the plurality of island regions located at the second side of the island region are located in a same row of island regions;

another second region in the third bridge region is directly connected to one of the plurality of island regions located at the third side of the island region and closest to the island region, and another second region in the fourth bridge region is directly connected to one of the plurality of island regions located at the fourth side of the island region and closest to the island region; the island region, the one of the plurality of island regions located at the third side of the island region, and the one of the plurality of island regions located at the fourth side of the island region are located in a same column of island regions.

15. A display apparatus, comprising at least one display panel according to claim 1.

16. The display apparatus according to claim 15, wherein the at least one display panel includes one display panel; and the display apparatus further comprises a reel, and one edge of the display panel is fixed to the reel.

17. The display apparatus according to claim 15, wherein the at least one display panel includes two display panels;

the two display panels include a first display panel and a second display panel;

the display apparatus further comprises sliding guide rails disposed on two opposite sides of the first display panel, and sliders disposed on two opposite sides of the second display panel, and each slider is arranged in a corresponding sliding guide rail and slidably connected to the corresponding sliding guide rail.

\* \* \* \* \*